(12) United States Patent
Chiu et al.

(10) Patent No.: US 12,518,993 B2
(45) Date of Patent: Jan. 6, 2026

(54) RETICLE POD WITH BACKSIDE STATIC DISSIPATION

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsin-Min Hsueh, New Taipei (TW); Yu-Ruei Chen, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 18/399,889

(22) Filed: Dec. 29, 2023

(65) Prior Publication Data

US 2024/0312816 A1 Sep. 19, 2024

Related U.S. Application Data

(60) Provisional application No. 63/452,967, filed on Mar. 17, 2023.

(51) Int. Cl.
*H01L 21/673* (2006.01)
*G03F 1/66* (2012.01)
*G03F 7/00* (2006.01)
*H05F 3/00* (2006.01)

(52) U.S. Cl.
CPC ......... *H01L 21/67386* (2013.01); *G03F 1/66* (2013.01); *G03F 7/70741* (2013.01); *H01L 21/67359* (2013.01); *H05F 3/00* (2013.01)

(58) Field of Classification Search
CPC ......... H01L 21/67386; H01L 21/67359; G03F 1/66; G03F 7/70741; H05F 3/00
USPC ............................................... 206/710, 316.1
See application file for complete search history.

(56) References Cited

U.S. PATENT DOCUMENTS

| | | | |
|---|---|---|---|
| 7,450,219 B2 * | 11/2008 | Matsutori | H01L 21/67359 355/75 |
| 7,581,372 B2 * | 9/2009 | Durben | H01L 21/67353 53/471 |
| 7,931,146 B2 * | 4/2011 | Chiu | G03F 1/66 206/454 |
| 8,353,404 B2 * | 1/2013 | Chiu | H01L 21/67373 206/454 |

(Continued)

*Primary Examiner* — Steven A. Reynolds
(74) *Attorney, Agent, or Firm* — Troutman Pepper Locke LLP; Tim Tingkang Xia, Esq.

(57) ABSTRACT

A reticle pod with backside static dissipation has an inner pod defining an accommodation space for a reticle. Multiple flexible guiding components are correspondingly disposed on multiple outer mounting portions of the inner pod in order to guide an inner cover and an inner base of the inner pod to position without relative displacement. Multiple conductive retainers are correspondingly arranged in the accommodation space to push against a backside of the reticle and form a full-time electrical conduction with the back side of the reticle, so as to establish a static dissipation path by the conductive retainers and the inner pod. Meanwhile, with the conductive retainers pushing against the reticle as well as the flexible guiding components providing the inner cover and the inner base with automatic position guiding, the reticle is automatically pushed and positioned to a center position of the inner base.

20 Claims, 9 Drawing Sheets

(56) References Cited

U.S. PATENT DOCUMENTS

| | | | | |
|---|---|---|---|---|
| 2003/0218728 A1* | 11/2003 | del Puerto | ................ | G03F 1/64 |
| | | | | 355/75 |
| 2006/0201958 A1* | 9/2006 | Tieben | ............... | H01L 21/67353 |
| | | | | 220/4.23 |
| 2006/0237338 A1* | 10/2006 | Nakamae | .......... | H01L 21/67383 |
| | | | | 206/316.1 |
| 2008/0160235 A1* | 7/2008 | Wu | ................... | H01L 21/67353 |
| | | | | 428/34.1 |
| 2010/0140126 A1* | 6/2010 | Lu | ........................ | B65D 85/48 |
| | | | | 206/455 |
| 2011/0155598 A1* | 6/2011 | Lu | ............................ | G03F 1/66 |
| | | | | 206/349 |
| 2012/0037522 A1* | 2/2012 | Chiu | ................ | H01L 21/67359 |
| | | | | 206/316.1 |
| 2012/0175279 A1* | 7/2012 | Ku | ..................... | G03F 7/70741 |
| | | | | 206/454 |
| 2013/0126378 A1* | 5/2013 | Ku | .................... | H01L 21/67386 |
| | | | | 206/454 |
| 2013/0248399 A1* | 9/2013 | Lin | ....................... | B65D 45/16 |
| | | | | 206/454 |
| 2019/0214287 A1* | 7/2019 | Chiu | .................... | G03F 7/70733 |
| 2020/0249563 A1* | 8/2020 | Hsueh | ................ | G03F 7/70733 |
| 2020/0335371 A1* | 10/2020 | Chuang | ............ | H01L 21/67376 |
| 2021/0116821 A1* | 4/2021 | Chuang | ............ | H01L 21/67359 |

\* cited by examiner

RETICLE POD WITH BACKSIDE STATIC DISSIPATION

CROSS-REFERENCE TO RELATED APPLICATIONS

This divisional application claims priority under 35 U.S.C. § 119(a) on Patent Application No. 63/452,967 filed in U.S. on Mar. 17, 2023 the entire contents of which are hereby incorporated by reference.

BACKGROUND OF THE INVENTION

Field of the Invention

The present invention relates to a reticle carrier or a reticle pod, and more particularly, to a reticle pod with a backside static dissipation path formed by a full-time contact and electrical conduction.

Description of the Prior Art

Accompanied with the development of technologies, with nanometer size miniaturization of semiconductor devices and refinement of electronic product functions, the hazard or potential damage to semiconductor workpieces caused by electrostatic discharge (ESD) is a problem that the industry focuses on and struggles to solve. Contamination caused by static absorption in particular, under the effect of an static force, the adsorption caused by static electricity to dust particles results in contamination of semiconductor workpieces (such as reticles), leading in an increase in defective rates.

Taking a double-layer reticle pod for example, in an extreme ultraviolet (EUV) lithography process, a reticle needs to be protected by a dual pod (extreme ultraviolet reticle transport pod (EUV POD)). A current dual pod includes an outer pod and an inner pod, wherein the reticle is accommodated in the inner pod and the inner pod is accommodated in the outer pod. Due to a low-humidity environment in an exposure machine, after a reticle undergoes exposure in a vacuum cavity of the machine, static electricity remains on metal coatings on a front side and a back side of the reticle. A current inner pod offers a function of dissipating the static electricity on the front side (FS) of the reticle. However, for the back side of the reticle, the reticle first needs to be removed from the vacuum cavity and the inner pod is covered by the outer pod, and a conduction path can then be established for static dissipation. Thus, a large amount of static electricity is accumulated when the inner pod is not yet covered by the outer pod, such that dust particles are absorbed to the back side of the reticle and contaminate the reticle. An outer pod of a current double-layer reticle pod is configured to have a pressing mechanism capable of pushing a reticle retainer of the inner pod. However, once the outer pod is opened, the reticle retainer of the inner pod cannot be pushed in a way that the function of limiting the displacement of the reticle can no longer be achieved. Thus, it is possible that friction is generated between the front side of the reticle and a reticle support member of the inner pod, and dust can then be generated to contaminate the reticle.

Therefore, there is a need for a solution to solve the issues of the prior art, including a disconnected static dissipation path caused by the failure of contact between a reticle retainer of the inner pod and a reticle when an outer pod is opened, as well as the inability of limiting displacement of a reticle caused by the failure of contact between a reticle retainer of the inner pod and a reticle when an outer pod is opened.

SUMMARY OF THE INVENTION

The present invention provides a reticle pod with backside static dissipation so as to solve the numerous issues of a large amount of static charge accumulated on a back side of a reticle and the inability of limiting displacement of a reticle as described above.

It is an object of the present invention to provide a reticle pod with backside static dissipation. The reticle pod is suitable for a dual pod including an outer pod and an inner pod accommodated in the outer pod. The inner pod includes an inner base, an inner cover, multiple flexible guiding components and multiple conductive retainers. The inner cover is configured to cover the inner base. The inner base is combined with the inner base to define an accommodation space, and multiple outer mounting portions located outside the accommodation space, wherein the accommodation space is for accommodating a reticle. The multiple flexible guiding components are correspondingly disposed on the multiple outer mounting portions, and guide the inner cover and the inner base to position without relative displacement. The multiple conductive retainers are correspondingly arranged in the accommodation space to push against a back side of the reticle, such that the multiple conductive retainers form a full-time electrical conduction with the back side of the reticle, accordingly establishing a static dissipation path along the multiple conductive retainers, the inner cover and the inner base. With the conductive retainers pushing against the reticle as well as the flexible guiding components providing the inner cover and the inner base with automatic position guiding, the reticle is enabled to be automatically pushed and positioned to a center position of the inner base.

In a specific embodiment, at least one of the multiple conductive retainers include: a retaining base, disposed on an inner side of the inner cover; and at least one sloped retaining portion, one end of each sloped retaining portion coupled to the retaining base and the other end retaining the back side of the reticle.

In a specific embodiment, at least one of the multiple conductive retainers include: a retaining base, disposed on an inner side of the inner base; and at least one flexible retaining portion, one end of the flexible retaining portion coupled to the inner base and the other end retaining the back side of the reticle.

In a specific embodiment, the reticle pod further includes at least one auxiliary conductive component disposed on an inner side of the inner cover to push against the back side of the reticle, such that the auxiliary conductive component and the multiple conductive retainers simultaneously form a full-time electrical conduction with the back side of the reticle, accordingly establishing a static dissipation path by the auxiliary conductive component, the multiple conductive retainers, the inner cover and the inner base.

In a specific embodiment, two adjacent sides of the inner cover combined with the inner base are disposed with the outer mounting portions, wherein the outer mounting portions and the flexible guiding components are configured to match structurally.

In a specific embodiment, each of the outer mounting portions includes an inner cover mounting portion and an inner base mounting portion, and each of the flexible guiding component is disposed on both the inner cover mounting portion and the inner base mounting portion. The flexible guiding component includes: a guiding base, fixed on the inner cover mounting portion; and at least one extender, one end of the extender connected to the guiding base and the other end pushing against the inner base mounting portion.

In a specific embodiment, the extender is further provided with at least one protrusion for pushing against the inner base mounting portion.

In a specific embodiment, the inner base mounting portion includes at least one recess. The recess is not connected to a top edge on an outer side of the inner base, and a portion of the extender is located in the recess.

It is an object of the present invention to provide a reticle pod with backside static dissipation. The reticle pod is suitable for a dual pod including an outer pod and an inner pod accommodated in the outer pod. The inner pod includes an inner base, an inner cover, multiple flexible guiding components and multiple conductive retainers. The inner cover is configured to cover the inner base. The inner cover is combined with the inner base to define an accommodation space, and multiple outer mounting portions located outside the accommodation space, wherein the accommodation space is for accommodating a reticle. The multiple flexible guiding components are correspondingly disposed on the multiple outer mounting portions, and guide the inner cover and the inner base to position without relative displacement. The multiple conductive retainers are correspondingly arranged in the accommodation space to push against a back side of the reticle, such that the multiple conductive retainers form a full-time electrical conduction with the back side of the reticle, accordingly establishing a static dissipation path along the multiple conductive retainers, the inner cover and the inner base. With the conductive retainers pushing against the reticle as well as the flexible guiding components providing the inner cover and the inner base with automatic position guiding, the reticle is enabled to be automatically pushed and positioned to a center position of the inner base. The inner pod and all of the components arranged at the inner pod are made of charge dissipative materials, and static charge on the back side are electrically conducted through the multiple conductive retainers, accordingly forming an static dissipation path established by the multiple conductive retainers, the inner pod and all the components.

With the embodiments above, the inner pod does not need assistance of the outer pod or other external forces, and a static dissipation path can be established by the inner pod itself by means of covering the inner base by the inner cover. That is, even if an outer cover of the outer pod is not closed, the conductive retainers or the flexible guiding components on the inner cover are still capable of establishing a static dissipation path on their own to eliminate static charge present on the back side of the reticle. The front side of the reticle has a pattern, and the back side is located on a side opposite to the front side.

With the embodiments above, the inner pod does not need assistance of the outer pod or other external forces, the conductive retainers are sufficient to limit the movement of the reticle by means of merely covering the inner base by the inner cover, and the flexible guiding components further limit relative displacement between the inner cover and the inner base. Moreover, by configuring the conductive retainers and the flexible guiding components to match structurally, the reticle accommodated in the accommodation space at the same time can be automatically guided to a center position of the inner base. The present invention reliably solves the issues of a reticle contaminated by dust generated by internal friction between the reticle and an inner pod when the reticle becomes no longer retained while an outer pod is opened.

It is another object of the present invention to provide a reticle pod with backside static dissipation, the reticle pod including an inner cover, an inner base, multiple conductive retainers and multiple flexible guiding components. The inner cover and the inner base are combined with each other to define an accommodation space for accommodating a reticle. The multiple conductive retainers establish an static dissipation path with the inner cover and the inner base, and the multiple conductive retainers are configured to in full-time push against a back side of the reticle in the accommodation space when the inner cover is combined with the inner base, so that charge on the back side of the reticle can be dissipated through the static dissipation path. The multiple flexible guiding components are fixed on an outer periphery of the inner cover, and the multiple conductive retainers are configured to be able to push against multiple outer side surfaces of the inner base when the inner cover is combined with the inner base, thereby automatically guiding the inner cover and the inner base to position without relative displacement.

With the embodiments above, the multiple conductive retainers are arranged on an inner side of the inner cover, and are not exposed on an outer side of the inner cover.

With the embodiments above, each of the flexible guiding components includes a guiding base and a pair of extenders extending downward from the guiding base. When the inner cover is combined with the inner base, the pair of extenders extend downward from an outer side of the inner cover and simultaneously push against two adjacent sides of the inner base, so as to automatically guide the inner cover and the inner base to position without relative displacement.

With the embodiments above, the guiding base is fixed on a corner of the inner cover.

BRIEF DESCRIPTION OF THE DRAWINGS

Reference can be made to the drawings and description below to better understand the present invention. Non-limiting and non-exhaustive embodiments are described with reference to the drawings below. It is to be noted that the elements in the drawings are not necessarily drawn to their actual sizes, and are depicted to focus on the description on structures and principles.

DETAILED DESCRIPTION OF THE EMBODIMENTS

To better describe the present invention, specific examples and specific embodiments are given with the accompanying drawings below. However, the subject matter of the application may be specifically implemented in various different forms, and the construction covered or asserted by the subject matter of the application is not limited to any exemplary specific embodiments disclosed in the detailed description of the application; it should be understood that the specific embodiments are non-limiting and are not to be construed as restrictive. Similarly, the present invention is to provide a reasonably broad scope for the subject matter applied or covered by the subject matter. Moreover, the accompanying drawings and examples in the present invention are not drawn to actual scales, and are not intended to correspond to actual relative sizes.

For the purposes of consistency and better understanding, the same features are represented by symbols and numerals in these exemplary accompanying drawings (although not represented as such in some examples). However, the features in different embodiments can be different in other aspects, and such features are not to be narrowly limited to the features shown in the accompanying drawings. The terms "first" and "second" in the description and the accompanying drawings are used to differentiate different objects, and are not to be construed as describing any specific order.

Figure 1:
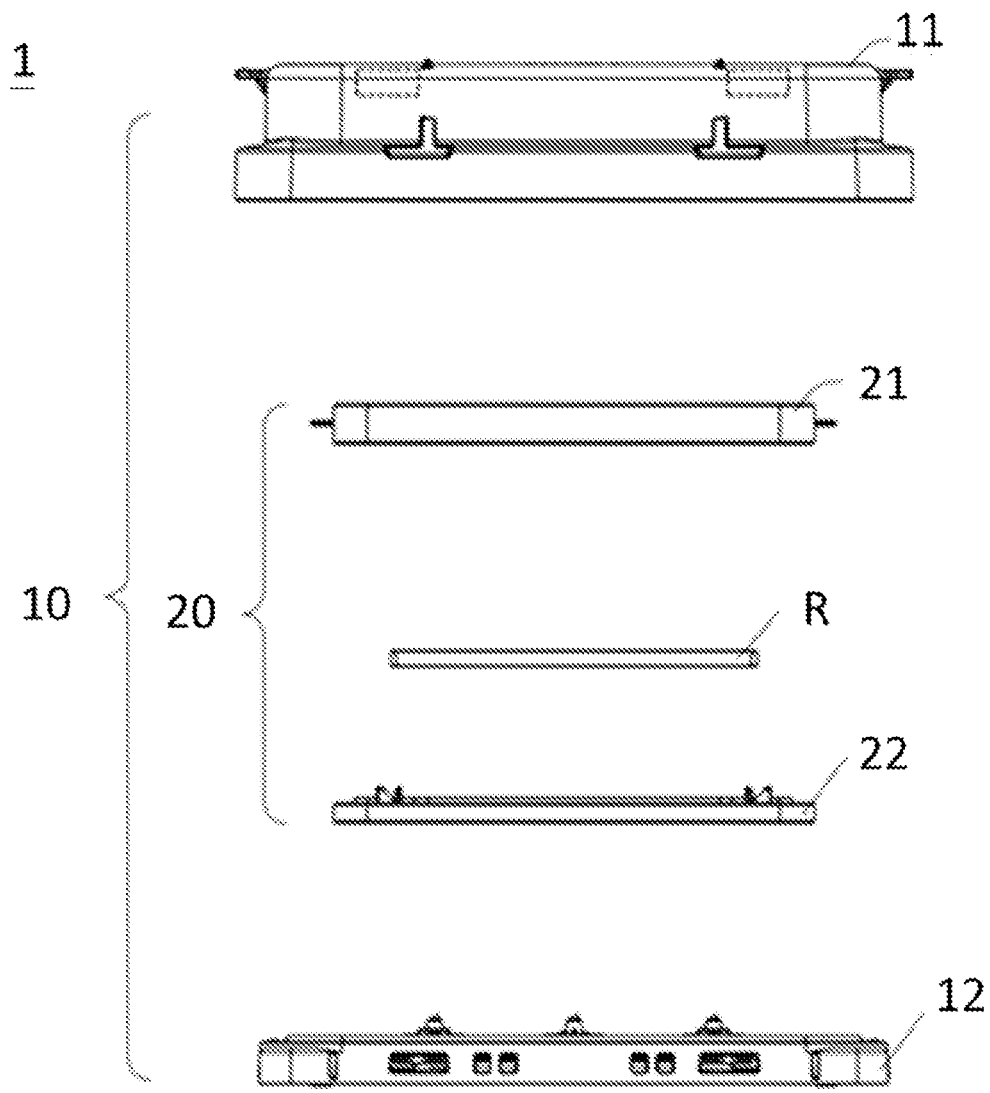
FIG. 1 is an exploded side view of a dual pod of the present invention.

Referring to FIG. 1, FIG. 1 shows an exploded side view of a dual pod of the present invention. The reticle pod 1 is a dual pod including an outer pod 10 and an inner pod 20 accommodated in the outer pod 10. In this embodiment, the dual pod may be a dual pod such as an extreme ultraviolet (EUV) reticle transport pod, or in the form of a transport pod, other than a dual pod, capable of carrying a semiconductor workpiece. The inner pod 20 may be a EUV inner pod (EIP), and the outer pod 10 may be a EUV outer pod (EOP). The inner pod 20 includes an inner cover 21 and an inner base 22, wherein the inner base 22 can receive a semiconductor workpiece R (for example, a reticle). The outer pod 10 includes an outer cover 11 and an outer base 12, wherein the outer cover 11 is combine with the outer base 12 to define an accommodation space for accommodating the inner pod 20. To provide the semiconductor workpiece R that is both sensitive and prone to damage with thorough protection, the inner cover 21 and the inner base 22 may have an electrostatic dissipative property. A material with an electrostatic dissipative property may include a static dissipative material, for example, a material with a surface resistance of $10^4$ to $10^{11}\Omega$, or a conductive material, for example, a material with a surface resistance less than $10^{11}\Omega$, or any other combination of static dissipative materials.

Figure 2:
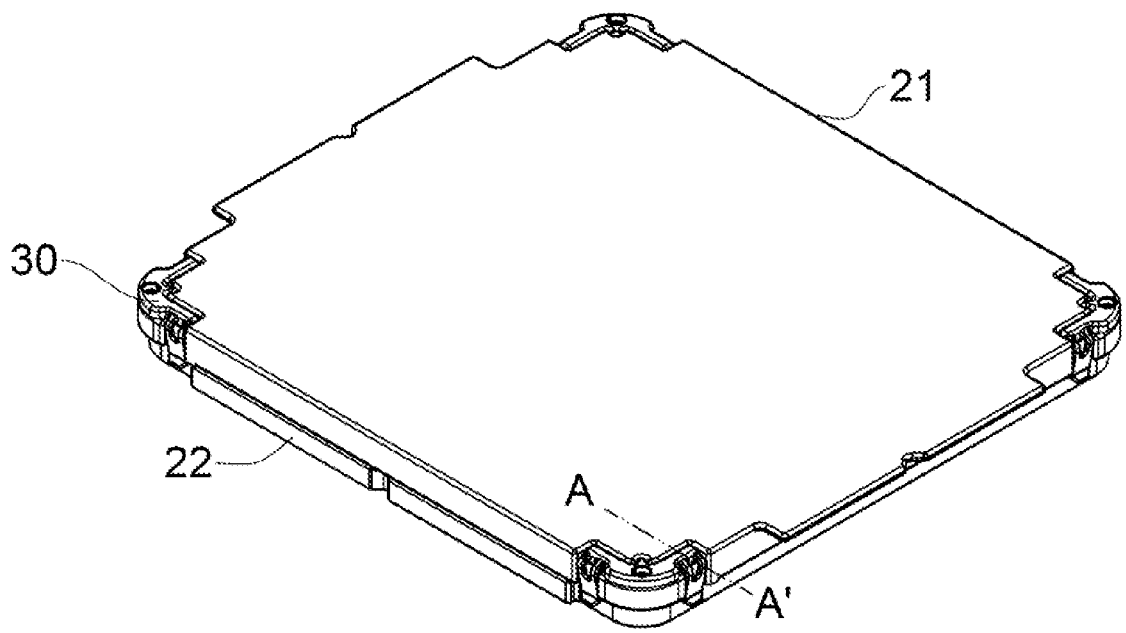
FIG. 2 is a perspective diagram of an inner pod of the present invention.
Figure 3:
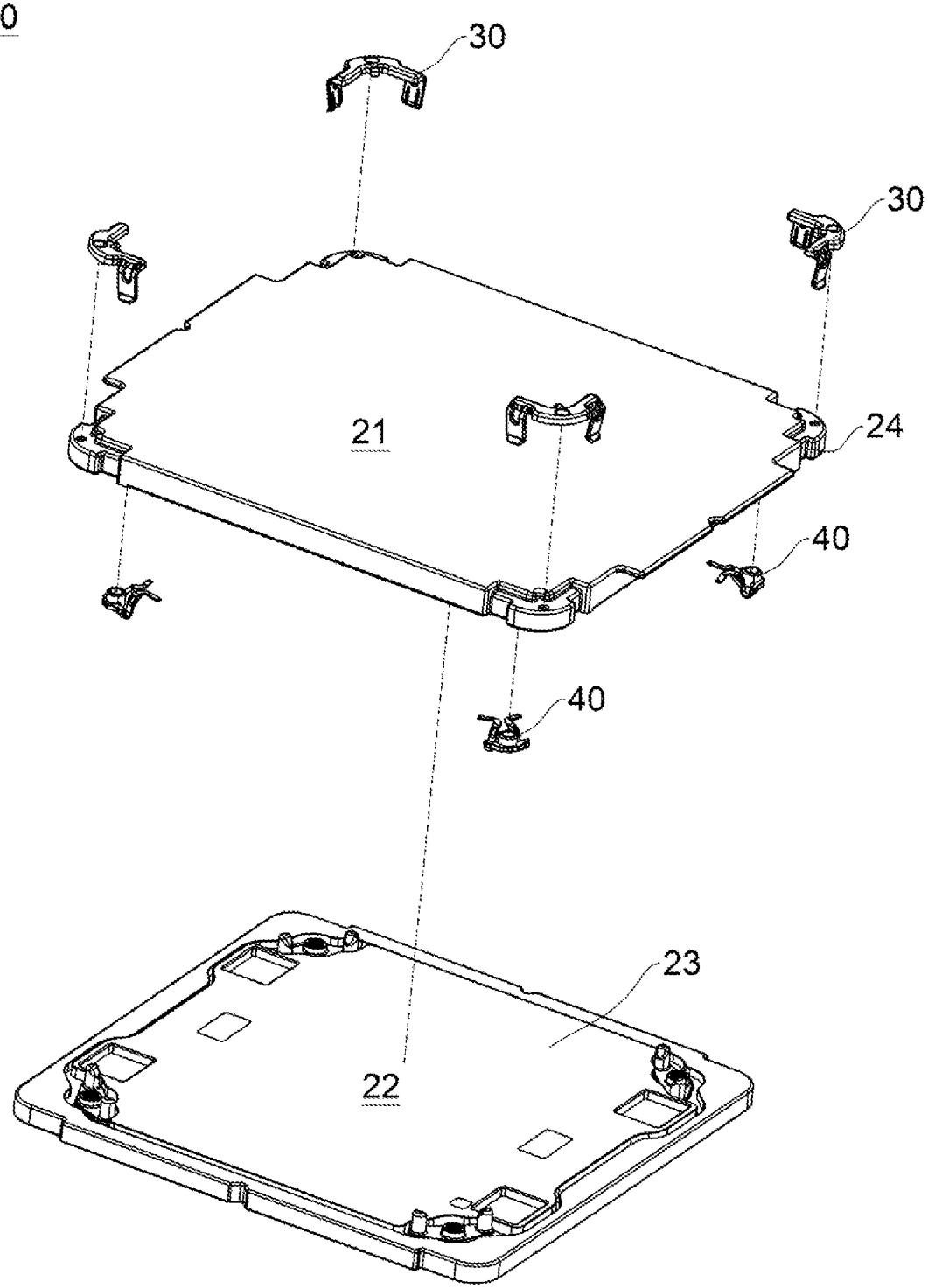
FIG. 3 is an exploded diagram of an inner pod of the present invention.
Figure 4:
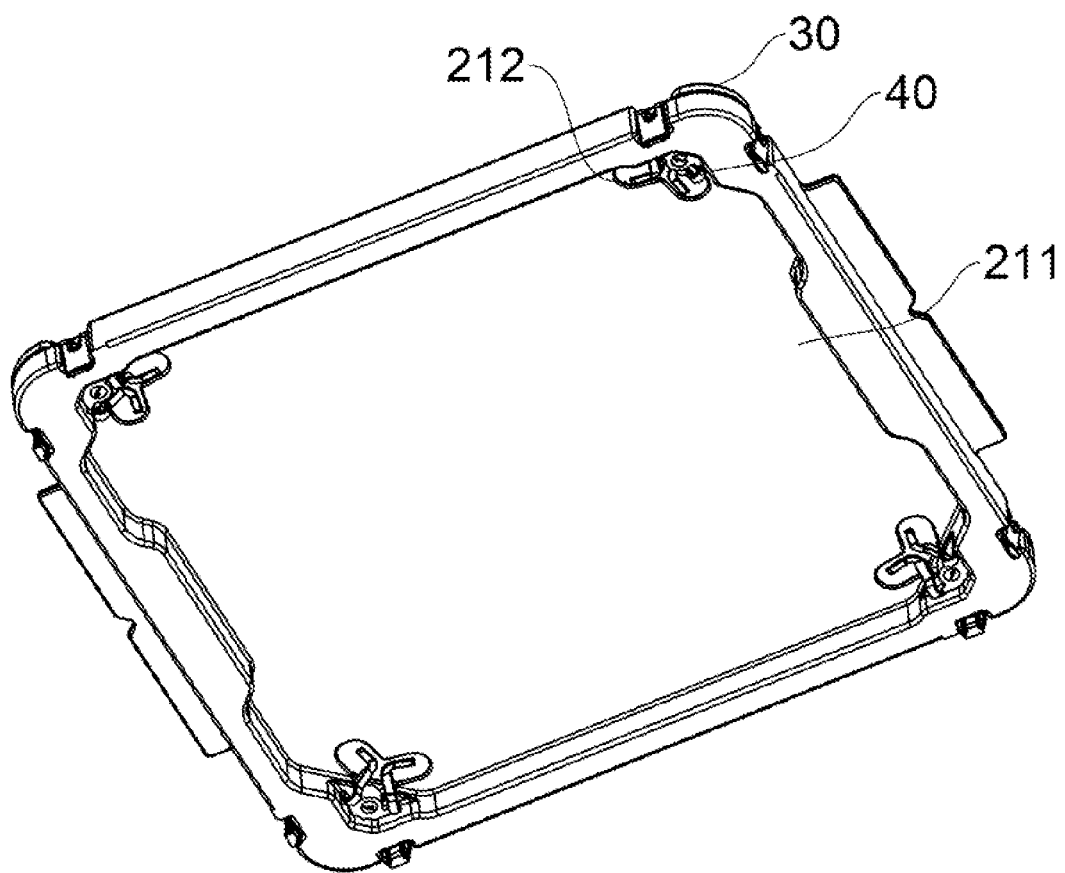
FIG. 4 is a bottom view of an inner cover of an inner pod of the present invention.
Figure 5:
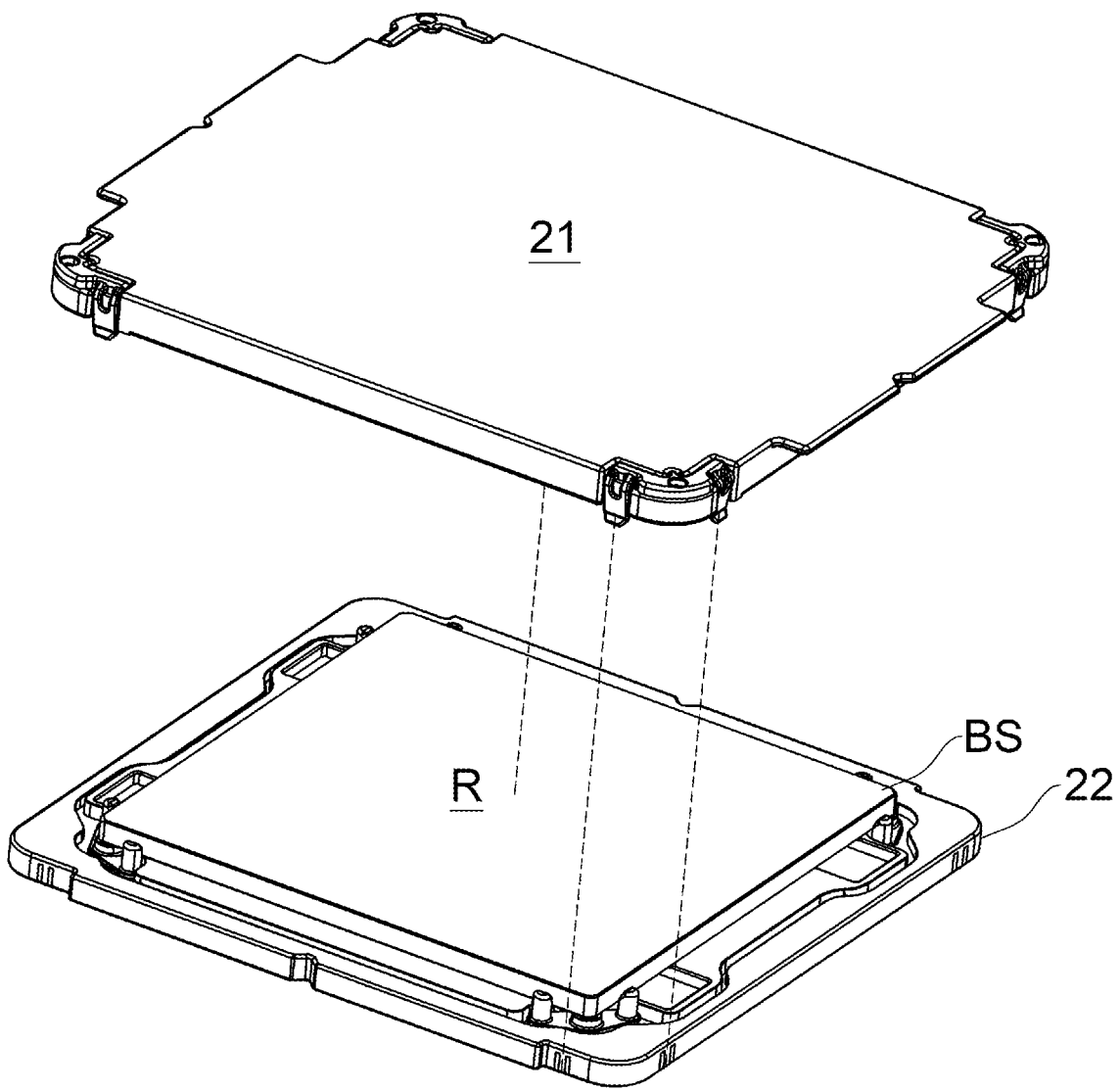
FIG. 5 is a schematic diagram of an inner pod of the present invention accommodating a semiconductor workpiece (for example, a reticle).
Figure 6:
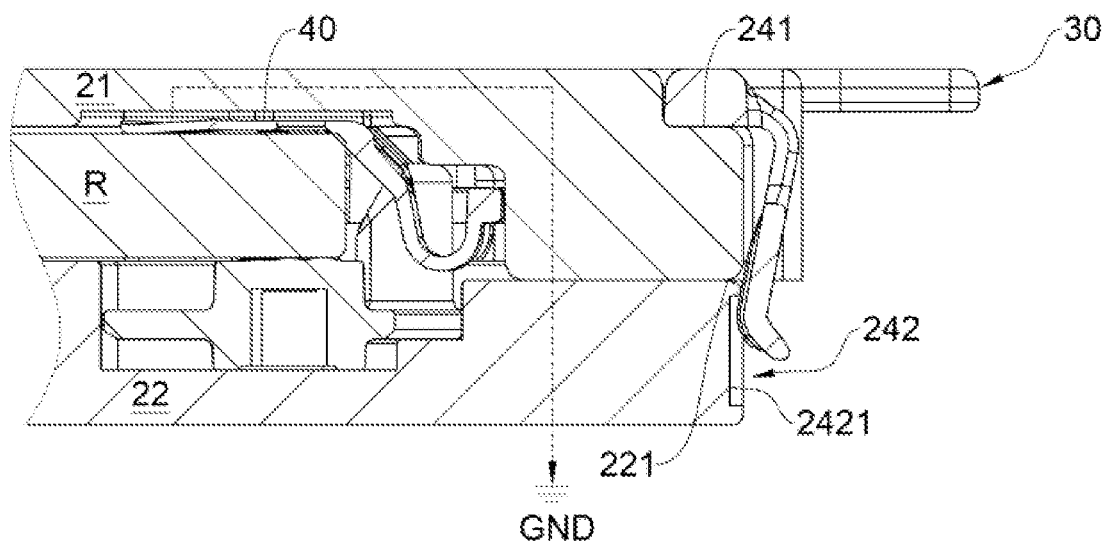
FIG. 6 is a section diagram along the section line A-A' in FIG. 2.

Details are given below to further demonstrate that the inner pod 20 does not need assistance of the outer pod 10 or other external forces, and a static dissipation path can be established by the inner pod 20 itself by means of covering the inner base 22 by the inner cover 21. First of all, structures of components configured at the inner pod 20 are described. Referring to FIG. 2 to FIG. 6, FIG. 2 shows a perspective diagram of an inner pod of the present invention, FIG. 3 shows an exploded diagram of an inner pod of the present invention, FIG. 4 shows a bottom view of an inner cover of an inner pod of the present invention, FIG. 5 shows a schematic diagram of an inner pod of the present invention accommodating a semiconductor workpiece, and FIG. 6 shows a section diagram along the section line A-A' in FIG. 2.

The inner cover 21 of the inner pod 20 is configured to cover the inner base 22, and the inner cover 21 is combined with the inner base 22 to define an accommodation space. Multiple outer mounting portions 24 are disposed on an outer side of the inner pod 20 located outside the accommodation space 23. The accommodation space 23 is for accommodating the semiconductor workpiece R. The inner pod 20 further includes multiple flexible guiding components 30 and multiple conductive retainers 40. The multiple flexible guiding components 30 are respectively correspondingly disposed on the multiple outer mounting portions 24, and guide the inner cover 21 and the inner base 22 to position without relative displacement. The multiple conductive retainers 40 are arranged in the accommodation space 23 to push against a back side BS of the semiconductor workpiece R, such that the conductive retainers 40 form a full-time electrical conduction with the back side BS of the semiconductor workpiece R while the inner cover 21 and the inner base 22 are combined, accordingly forming a static dissipation path established by the multiple conductive retainers 40, the inner cover 21 and the inner base 22. A material forming the conductive retainers 40 can be selected from the materials having an electrostatic dissipative property described above, or the conductive retainers 40 can be partially selected from the materials having an electrostatic dissipative property described above, so that at least a portion of the conductive retainers 40 can form a conduction with the inner cover 21.

In this embodiment, the conductive retainers 40 are arranged on an inner side 211 of the inner cover 21. As shown in FIG. 4, these conductive retainers 40 are located on chamfers of the inner side 211, that is, positions at four corners of the inner side 211 of the inner cover 21. Again referring to the static dissipation path shown in FIG. 6, when the inner cover 21 covers the inner base 22, sloped surfaces of these conductive retainers 40 can push against chamfers of the semiconductor workpiece R, and ends of the conductive retainers 40 abut against the back side BS of the semiconductor workpiece R, thereby allowing charge accumulated on the back side BS of the semiconductor workpiece R to dissipate to a ground GND through the static dissipation path along the conductive retainers 40, the inner cover 21 and the inner base 22.

Since the conductive retainers 40 do not require a pressing mechanism of an outer cover to provide a retaining force, the conductive retainers 40 are capable of persistently pushing against the semiconductor workpiece R by using its own structural design and flexibility when the inner cover 21 is combined with the inner base 22. Although the conductive retainers 40 are capable of retaining the semiconductor workpiece R, the inner cover 21 and the inner base 22 are not limited by each other. Thus, the inner cover 21 and the inner base 22 may become horizontally shifted due to being pushed by the four conductive retainers 40, and the inner cover 21 may displace relative to the inner base 22 during transportation. Therefore, in order to build an inner pod with a backside static dissipation ability, the present invention further uses the flexible guiding components 30 to limit a relative relation between the inner cover 21 and the inner base 22.

Figure 11:
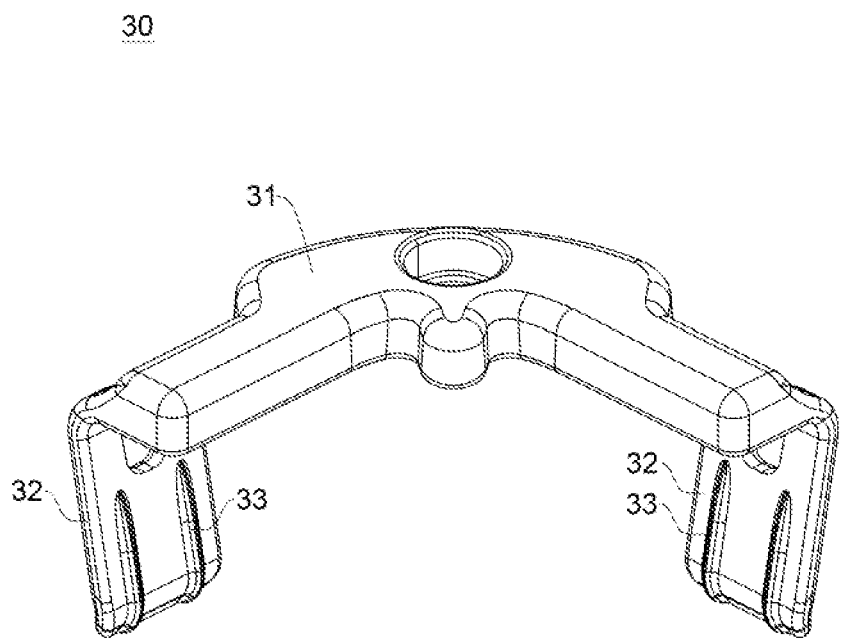
FIG. 11 is a perspective diagram of a flexible guiding component of the present invention.

In this embodiment, two adjacent sides of the inner cover 21 combined with the inner base 22, that is, on outer positions at which the inner pod and the outer pod are adjacent, are disposed with the outer mounting portions 24. The outer mounting portions 24 have a mounting plane lower than a top surface of the inner cover 21. The outer mounting portions 24 and the flexible guiding components 30 match structurally, such that the flexible guiding components 30 corresponding to adjacent chamfers of the outer pod. Each of the outer mounting portions 24 includes an inner cover mounting portion 241 and an inner base mounting portion 242, and each of the flexible guiding component 30 is disposed on both the inner cover mounting portion 241 and the inner base mounting portion 242. Referring to FIG. 11, each flexible guiding component 30 includes a guiding base 31 and at least one extender 32. The guiding base 31 is disposed on the inner cover mounting portion 241, and one end of the extender 32 is connected to the guiding base 31 and the other end extends downward from the guiding base 31 and abuts against the inner base mounting portion 242. With the above configuration relation of structural designs, when the inner cover 21 is combined with the inner base 22, by means of a guiding effect of the multiple flexible guiding components 30, no relative displacement is produced between the inner cover 21 and the inner base 22 of the inner pod 20. Meanwhile, the conductive retainers 40 are used in coordination to push the semiconductor workpiece R, thereby automatically guiding the semiconductor workpiece R to a center position of the inner base 22.

In this embodiment, the inner base mounting portion 242 includes a recess 2421. The recess 2421 is not connected to a top edge 221 on an outer side of the inner base 22. As shown in FIG. 6, when the inner cover 21 is combined with the inner base 22, a portion of the extender 32 is located in the recess 2421. This recess 2421 is designed to be sufficient to provide the extender 32 with a flexible buffer stroke and space, and thus a longitudinal section height of the recess 2421 is not connected to the top edge 221 on the outer side of the inner base 22, so as to avoid undesirable effects on the coverage and sealing of the inner cover 21 and the inner base 22. As a matter of course, the mounting portion 242 of the inner base 22 of the present invention can also be designed to exclude the recess 2421, and any design of the flexible guiding components 30 that prevents relative displacement between the inner cover 21 and the inner base 22 is to be encompassed within the scope of the present invention.

Figure 7:
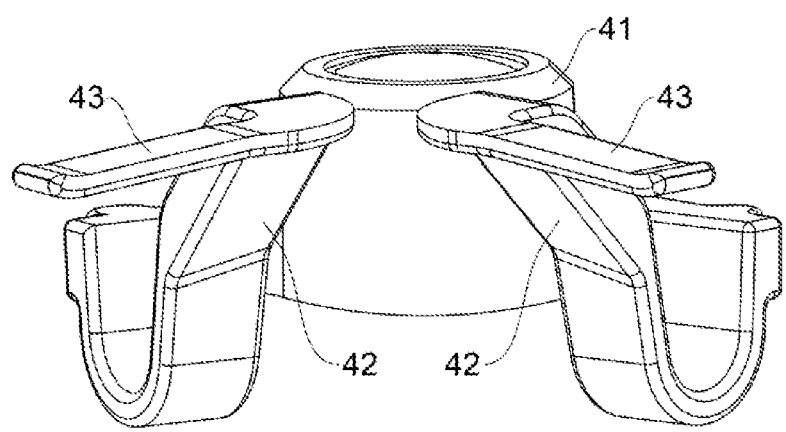
FIG. 7 is a perspective diagram of a conductive retainer of the present invention (with an inner cover of an inner pod omitted).
Figure 8:
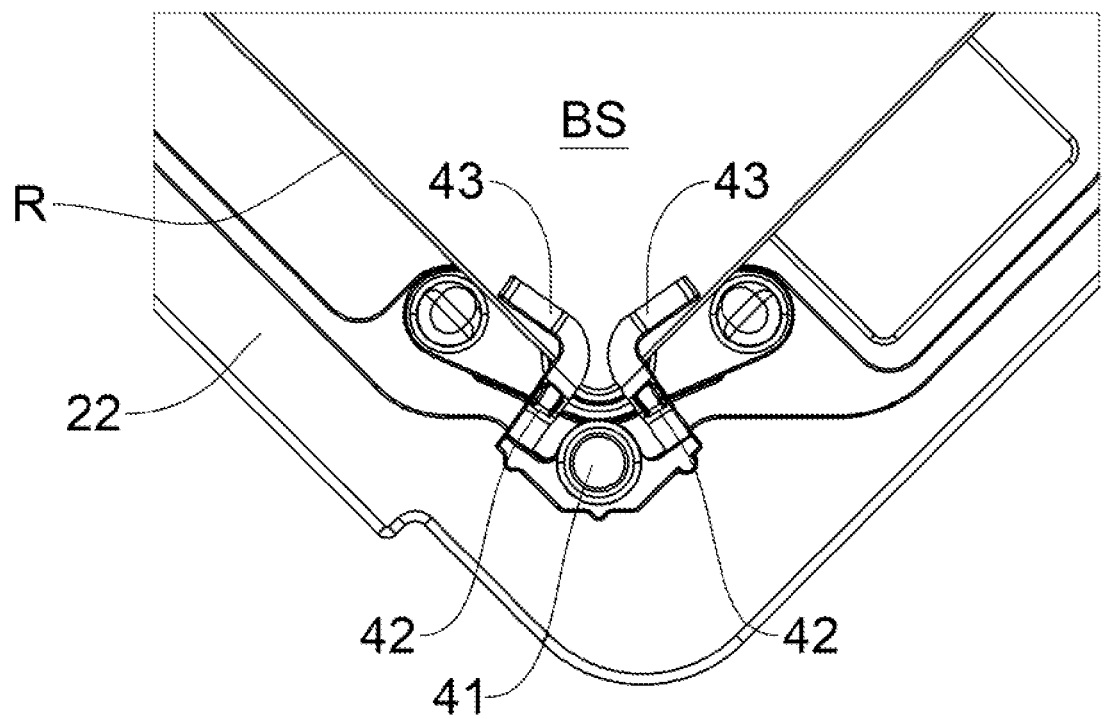
FIG. 8 is a schematic diagram of the conductive retainer in FIG. 7 pushing against a semiconductor workpiece.
Figure 9:
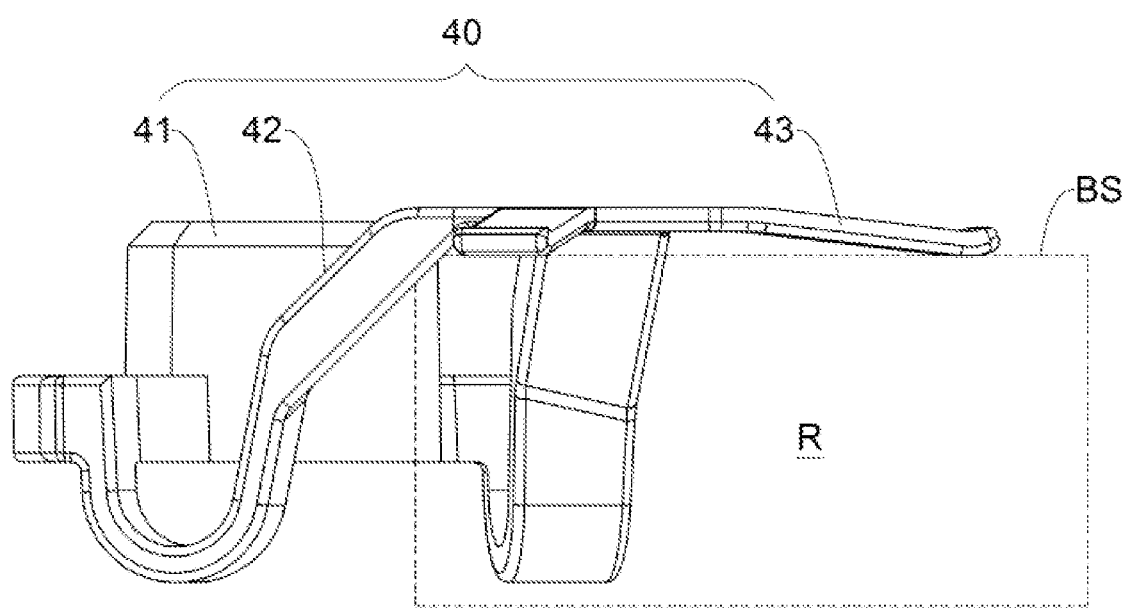
FIG. 9 is another diagram of the conductive retainer in FIG. 8 pushing against a semiconductor workpiece.

Critical functionality achieved by the multiple flexible guiding components 30 and the multiple conductive retainers 40 for the inner pod 20 can be understood from the description above. Next, structural design details of the multiple conductive retainers 40 are to be described below. Refer to FIG. 7 and FIG. 8. In this embodiment, the conductive retainers 40 are structurally designed to be arranged on the inner side 211 of the inner cover 21. When the semiconductor workpiece R is a rectangular reticle, the conductive retainers 40 then push against the back side BS of the semiconductor workpiece R and the adjacent sides, that is, the positions of chamfers. Preferably, all of the four chamfers are disposed with the conductive retainers 40, so that the semiconductor workpiece R can be effectively limited from displacement. When the semiconductor workpiece R is a non-rectangular reticle, the structural design of the conductive retainers 40 of the present invention is still applicable to achieve the same objects and effects of a full-time electrical conduction and a static dissipation path.

More specifically, at least one of the multiple conductive retainers 40 includes a retaining base 41 and at least one sloped retaining portion 42. The retaining base 41 is connected to the inner side 211 of the inner cover 21, and one end of the sloped retaining portion 42 is coupled to the retaining base 41 and the other end of the sloped retaining portion 42 extends in a direction of the back side BS of the semiconductor workpiece R. Thus, by means of contacting the adjacent sides (positions of the chamfers) of the semiconductor workpiece R by a pair of sloped surfaces, a retaining force for limiting displacement of the semiconductor workpiece R is provided. Next, an end of the sloped retaining portion 42 further includes a pressing portion 43. The pressing portion 43 is away from the retaining base 41, is flexible and slightly touches the back side BS of the semiconductor workpiece R, hence forming a full-time electrical conduction between the conductive retainers 40 and the semiconductor workpiece R. The pair of sloped retaining portions 42 may be two elements that are not connected to each other, and each of the sloped retaining portions 42 is provided with the pressing portion 43. The two sloped retaining portions 42 are jointly coupled to the retaining base 41, ends of the two sloped retaining portions 42 are respectively in contact with the adjacent sides of the semiconductor workpiece R by sloped surfaces, and the back side BS of the semiconductor workpiece R are in slight contact with the respective pressing portions 43.

Figure 10:
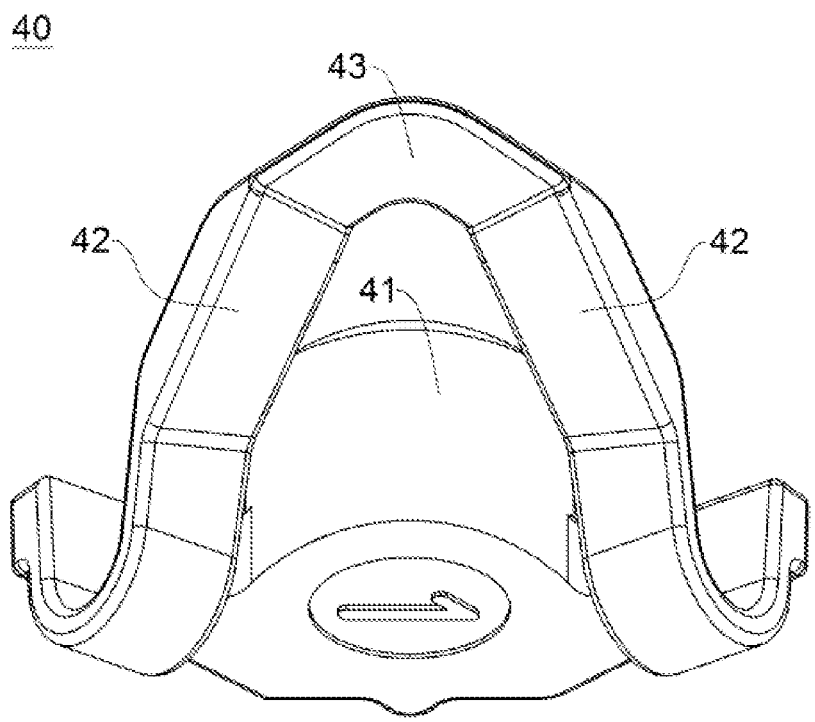
FIG. 10 is a perspective diagram of a variation example of a conductive retainer.

As a matter of course, the pressing portions 43 of the present invention can be adjusted as needed to have different structural designs, as shown in FIG. 10. One end of each of the two sloped retaining portions 42 and that of the other are jointly coupled to the retaining base 41, and the other ends are jointly coupled to one pressing portion 43. Similarly, the two sloped retaining portions 42 in FIG. 10 can respectively come into contact with the adjacent sides of the semiconductor workpiece R by sloped surfaces, the pressing portion 43 comes into slight contact with the back side BS of the semiconductor workpiece R, and the pressing portion 43 covers the position of the chamfers of the semiconductor workpiece R. Regardless of whether the inner pod 20 is accommodated in the outer pod 10 and whether the outer cover 11 is opened or closed, the inner pod 20 itself is capable of establishing a separate static dissipation path. When the inner cover 21 is combined with the inner base 22, with the full-time electrical conduction with the back side BS of the semiconductor workpiece R by means of all of the conductive retainers 40, a large amount of static charge continuously accumulated at the back side BS of the semiconductor workpiece R is dissipated to the ground GND through the static dissipation path along the conductive retainers 40, the inner cover 21 and the inner base 22.

Structural design details of multiple flexible guiding components 30 are further described below. Refer to FIG. 2, FIG. 6 and FIG. 11. In this embodiment, the flexible guiding components 30 are structurally designed to be disposed on adjacent outer edges of the inner pod 20. When the inner pod 20 is a rectangular body, the flexible guiding components 30 push against positions of the corners of the inner pod 20. Preferably, all of the four corners are disposed with the flexible guiding components 30, so as to guide the inner pod 20 and the inner base 22 to position without relative displacement. The guiding bases 31 of the flexible guiding component 30 are disposed on the inner cover mounting portions 241, and one end of the extender 32 is coupled to the guiding base 31 and the other end of the extender 32 extends in a direction of the inner base mounting portion 242 of the inner base 22. The extender 32 is flexible and is capable of persistently pushing against the outer side of the inner base 22, that is, the position of the inner base mounting portions 42, so as to flexibly slightly adjust an amount of displacement of the inner base 22. In response to the force of position guiding for relative limitation between the inner cover 21 and the inner base 22 provided by the guiding base 31 and the extender 32, the inner cover 21 and the inner base 22 are limited from relative displacement. The extender 32 is further provided with at least one protrusion 33, which flexibly and persistently pushes against the inner base mounting portion 242.

The extender 32 may be two elements that are not connected to each other, one end of each of the two extenders 32 and that of the other are jointly coupled to the guiding base 31, and the other ends respectively push against the adjacent sides of the inner base 22. As a matter of course, the extender 32 of the present invention can be adjusted to have different structural designs according to requirements. For example, one ends of the extenders 32 are jointly coupled to the guiding base 31 and the other ends are a continuous wall that extends in a direction of the inner base mounting portion 242 of the inner base 22, such that the extender 32 covers the positions of corners of the inner base 22. The present invention does not define the flexible guiding components 30 to structurally designed in any form, given that the flexible guiding components 30 are capable of continuously pushing against the outer side of the inner pod 20 such that the inner cover 21 and the inner base 22 are limited from relative displacement. Meanwhile, the conductive retainers 40 are used in coordination to push against the semiconductor workpiece R, so as to achieve automatic position guiding of the inner cover 21 and the inner base 22 to automatically push the semiconductor workpiece R to a center position of the inner base 22. Any design that achieves the above is to be encompassed within the scope of protection of the present invention.

Figure 12:
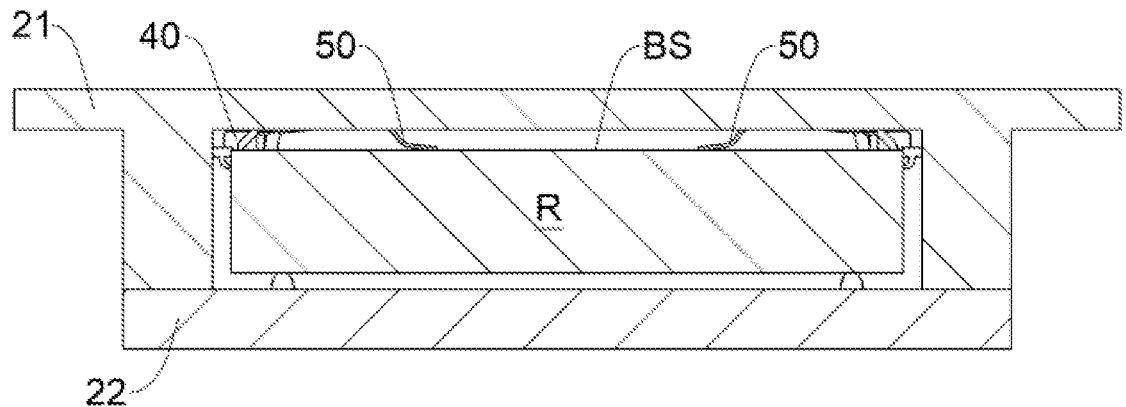
FIG. 12 is a schematic diagram of an additional auxiliary conductive component of the present invention.

Again referring to FIG. 12, the semiconductor workpiece retaining device further includes at least one auxiliary conductive component 50 disposed on the inner side 211 of the inner cover 21. When the inner cover 21 is combined with the inner base 22, the auxiliary conductive component 50 is for pushing against or contacting the back side BS of the semiconductor workpiece R. The auxiliary conductive component 50 can be a flexible conductive component or an elastic conductive component in any geometric shape. The present invention does not limit the auxiliary conductive component 50 to be structurally designed in any form, given that the auxiliary conductive component 50 includes a static dissipative material, for example, a material having a surface resistance of $10^4$ to $10^{11}\Omega$. Moreover, when the inner cover 21 is combined with the inner base 22, the auxiliary conductive component 50 and the conductive retainers 40 are simultaneously in a full-time electrical conduction with the back side BS of the semiconductor workpiece R for the inner cover 21 itself to establish a static dissipation path. Any design that achieves the above is to be encompassed within the scope of protection of the present invention. The newly added auxiliary conductive component 50 serves as a contact for a full-time electrical conduction to the back side BS of the semiconductor workpiece R, accordingly forming a static dissipation path along the auxiliary conductive component 50, the conductive retainers 40, the inner cover 21 and the inner base 22, thereby accelerating charge dissipation efficiency for static charge on the back side BS of the semiconductor workpiece R.

Figure 13:
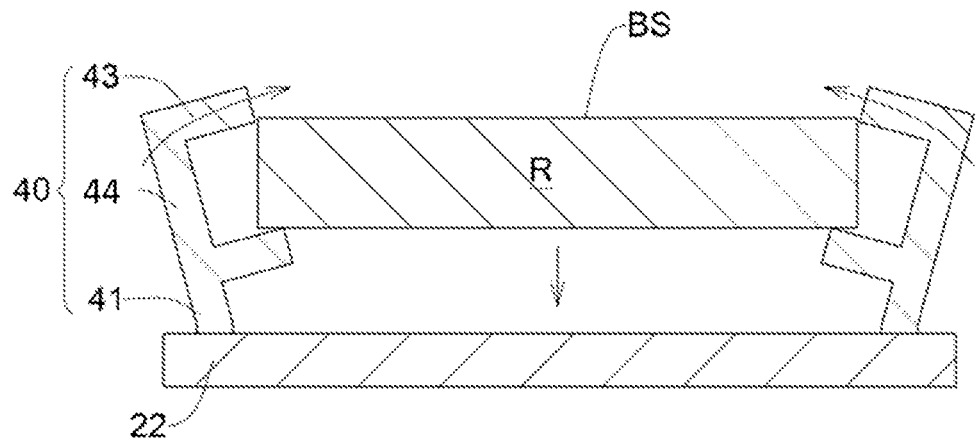
FIG. 13 is a schematic diagram of a conductive retainer of the present invention before pushing against a semiconductor workpiece.
Figure 14:
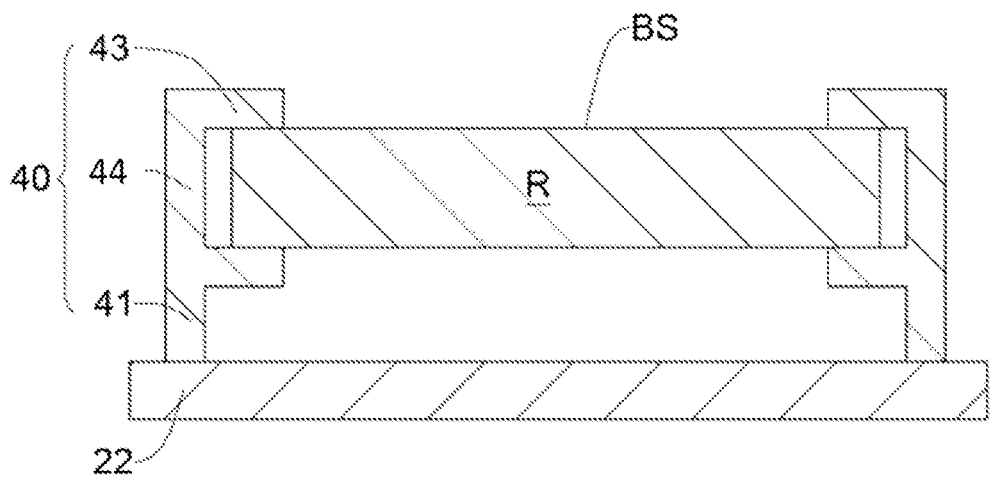
FIG. 14 is a schematic diagram of the conductive retainer in FIG. 13 after pushing against a semiconductor workpiece.

Again referring to FIG. 13 and FIG. 14, in this embodiment, according to another structural design, the conductive retainers 40 are arranged on the inner side of the inner base 22. At least one of the conductive retainers 40 includes a retaining base 41 and at least one flexible retaining portion 44. The retaining base 41 disposed on the inner side of the inner base 22. One end of the flexible retaining portion 44 is coupled to the retaining base 41, and further includes a pressing portion 43. The pressing portion 43 is flexible, and comes into slight contact with the back side BS of the semiconductor workpiece R. The flexible retaining portion 44 provides a force of pushing for limiting displacement of the semiconductor workpiece R. Regardless of whether being arranged on the inner side 211 of the inner cover 21 or the inner side of the inner base 22, the conductive retainers 40 are for pushing against the back side BS of the semiconductor workpiece R, so as to achieve the objects and effects of a full-time electrical conduction and an static dissipation path.

The inner pod 20 and all components arranged at the inner pod 20 are made of charge dissipative materials, and include material properties of having a surface resistance of $10^4$ to $10^{11}\Omega$, wherein the components include a support component for supporting the semiconductor workpiece R, a gas flow component or any component in structures and designs required in the inner pod 20. Any design that enables the back side BS of the semiconductor workpiece R to establish a full-time electrical conduction sufficient for the inner pod 20 itself to establish a static dissipation path, for example, a static dissipation path along the conductive retainers 40, the inner cover 21, the inner base 22 and the components, is to be encompassed within the scope of protection of the present invention.

In conclusion, the inner pod is provided with flexible guiding components, conductive retainers and static dissipative components. Thus, the inner pod does not need assistance of the outer pod or other external forces, the conductive retainers are sufficient to limit the movement of the semiconductor workpiece by means of merely covering the inner base by the inner cover and provide a function of a full-time electrical conduction, and the flexible guiding components further limit relative displacement between the inner cover and the inner base. Moreover, by configuring the conductive retainers and the flexible guiding components to match structurally, the semiconductor workpiece accommodated in the accommodation space at the same time can be automatically guided to a center position of the inner base. The present invention reliably solves the issues of a semiconductor workpiece contaminated by dust generated by internal friction between the semiconductor workpiece and an inner pod when the reticle becomes no longer retained while an outer pod is opened.

However, it should be understood that, the specific embodiments of the present invention are for illustration purposes, and various modifications that may be made without departing from the scope of claims and spirit of the present invention are to be encompassed within the scope of the appended claims. Therefore, the specific embodiments given in the description of the present disclosure are not to be construed as limitations to the present invention, and the essential scope and spirit of the present invention are as disclosed in the appended claims.

What is claimed is:

1. A reticle pod with backside static dissipation, the reticle pod being adapted for a dual pod comprising an outer pod and an inner pod accommodated in the outer pod, the inner pod comprising:
    an inner base;
    an inner cover, configured to be combined with the inner base to define an accommodation space and a plurality of outer mounting portions located outside the accommodation space, wherein the accommodation space is for accommodating a reticle;
    a plurality of flexible guiding components, respectively correspondingly disposed on the outer mounting portions, the plurality of flexible guiding components guiding the inner cover and the inner base to position without relative displacement; and
    a plurality of conductive retainers, arranged in the accommodation space, the plurality of conductive retainers pushing against a back side of the reticle, such that the conductive retainers form a full-time electrical conduction with the back side of the reticle, so as to form a static dissipation path established by the conductive retainers, the inner cover and the inner base;
    wherein, by the conductive retainers pushing against the reticle, and the flexible guiding components automatically guiding the inner cover and the inner base in position, the reticle is automatically pushed and positioned to a center position of the inner base.

2. The reticle pod with backside static dissipation according to claim 1, wherein at least one of the conductive retainers comprises:
    a retaining base, disposed on an inner side of the inner cover; and
    at least one sloped retaining portion, one end of the sloped retaining portion coupled to the retaining base and the other end of the sloped retaining portion retaining the back side of the reticle.

3. The reticle pod with backside static dissipation according to claim 1, wherein at least one of the conductive retainers comprises:
    a retaining base, disposed on an inner side of the inner base; and
    at least one flexible retaining portion, one end of the flexible retaining portion coupled to the retaining base and the other end of the flexible retaining portion retaining the back side of the reticle.

4. The reticle pod with backside static dissipation according to claim 1, further comprising at least one auxiliary conductive component disposed on an inner side of the inner cover to push against the back side of the reticle, such that the auxiliary conductive component and the conductive retainers simultaneously form a full-time electrical conduction with the back side of the reticle, so as to form the static dissipation path established by the auxiliary conductive component, the conductive retainers, the inner cover and the inner base.

5. The reticle pod with backside static dissipation according to claim 1, wherein two adjacent sides of the inner cover combined with the inner base are provided with the outer mounting portions, and the outer mounting portions and the flexible guiding components are configured to match structurally.

6. The reticle pod with backside static dissipation according to claim 5, wherein each of the outer mounting portions comprises an inner cover mounting portion and an inner base mounting portion, each of the flexible guiding component is disposed on the inner cover mounting portion and the inner base mounting portion, and the flexible guiding component comprises:
    a guiding base, fixed on the inner cover mounting portion; and
    at least one extender, one end of the extender connected to the guiding base and one other end of the extender pushing against the inner base mounting portion.

7. The reticle pod with backside static dissipation according to claim 6, wherein the extender is further provided with at least one protrusion for pushing against the inner base mounting portion.

8. The reticle pod with backside static dissipation according to claim 6, wherein the inner base mounting portion comprises at least one recess, the recess is not connected to a top edge on an outer side of the inner base, and a portion of the extender is located in the recess.

9. A reticle pod with backside static dissipation, the reticle pod being adapted for a dual pod comprising an outer pod and an inner pod accommodated in the outer pod, the inner pod comprising:
    an inner base;
    an inner cover, configured to be combined with the inner base to define an accommodation space and a plurality of outer mounting portions located outside the accommodation space, wherein the accommodation space is for accommodating a reticle;
    a plurality of flexible guiding components, respectively correspondingly disposed on the outer mounting portions, the plurality of flexible guiding components guiding the inner cover and the inner base to position without relative displacement; and
    a plurality of conductive retainers, arranged in the accommodation space, the conductive retainers pushing against a back side of the reticle, such that all of the conductive retainers form a full-time electrical conduction with the back side of the reticle;
    wherein, by the conductive retainers pushing against the reticle, and the flexible guiding components automatically guiding the inner cover and the inner base in position, the reticle is automatically pushed and positioned to a center position of the inner base;
    wherein, the inner pod and all components disposed at the inner pod are made of charge dissipation materials, and static charge on the back side is electrically conducted through the conductive retainers, so as to form a static dissipation path established by the conductive retainers, the inner pod and the components.

10. The reticle pod with backside static dissipation according to claim 9, wherein at least one of the conductive retainers comprises:
    a retaining base, disposed on an inner side of the inner cover; and
    at least one sloped retaining portion, one end of the sloped retaining portion coupled to the retaining base and the other end of the sloped retaining portion retaining the back side of the reticle.

11. The reticle pod with backside static dissipation according to claim 9, wherein at least one of the conductive retainers comprises:
    a retaining base, disposed on an inner side of the inner base; and
    at least one flexible retaining portion, one end of each of the flexible retaining portion coupled to the retaining base and the other end of the flexible retaining portion retaining the back side of the reticle.

12. The reticle pod with backside static dissipation according to claim 9, further comprising at least one auxiliary conductive component disposed on an inner side of the inner cover to push against the back side of the reticle, such that the auxiliary conductive component and the conductive retainers simultaneously form a full-time electrical conduction with the back side of the reticle, so as to form the static dissipation path established by the auxiliary conductive component, the conductive retainers, the inner cover and the inner base.

13. The reticle pod with backside static dissipation according to claim 9, wherein two adjacent sides of the inner cover combined with the inner base are provided with the outer mounting portions, and the outer mounting portions and the flexible guiding components match structurally with each other.

14. The reticle pod with backside static dissipation according to claim 13, wherein each of the outer mounting portions comprises an inner cover mounting portion and an inner base mounting portion, each of the flexible guiding component is disposed on the inner cover mounting portion and the inner base mounting portion, and the flexible guiding component comprises:
    a guiding base, fixed on the inner cover mounting portion; and
    at least one extender, one end of the extender connected to the guiding base and one other end pushing against the inner base mounting portion.

15. The reticle pod with backside static dissipation according to claim 14, wherein the extender is further provided with at least one protrusion for pushing against the inner base mounting portion.

16. The reticle pod with backside static dissipation according to claim 14, wherein the inner base mounting portion comprises at least one recess, the recess is not connected to a top edge on an outer side of the inner base, and a portion of the extender is located in the recess.

17. A reticle pod with backside static dissipation, comprising:
    an inner cover and an inner base, combined with each other to define an accommodation space for accommodating a reticle;
    a plurality of conductive retainers, establishing a static dissipation path with the inner cover and the inner base, the plurality of conductive retainers configured to push against a back side of the reticle in the accommodation space in full-time when the inner cover is combined with the inner base, so that charge on a back side of the reticle can be dissipated through the static dissipation path; and
    a plurality of flexible guiding components, fixed on an outer periphery of the inner cover, and the plurality of flexible guiding components configured to push against a plurality of outer side surfaces of the inner base when the inner cover is combined with the inner base, thereby automatically guiding the inner cover and the inner base to position without relative displacement.

18. The reticle pod with backside static dissipation according to claim 17, wherein the plurality of conductive retainers are disposed on an inner side of the inner cover, and are not exposed on an outer side of the inner cover.

19. The reticle pod with backside static dissipation according to claim 17, wherein each of the flexible guiding components comprises a guiding base and a pair of extenders extending downward from the guiding base, and when the inner cover is combined with the inner base, the pair of extenders extend downward from an outer side of the inner cover and simultaneously push against two adjacent sides of the inner base, so as to automatically guide the inner cover and the inner base to position without relative displacement.

20. The reticle pod with backside static dissipation according to claim 19, wherein the guiding base is fixed on a corner of the inner cover.

* * * * *